(12) United States Patent
Kang et al.

(10) Patent No.: US 11,729,922 B2
(45) Date of Patent: Aug. 15, 2023

(54) DISPLAY PANEL AND DISPLAY DEVICE INCLUDING THE SAME

(71) Applicant: Samsung Display Co., LTD., Yongin-si (KR)

(72) Inventors: Ki Nyeng Kang, Sejong-si (KR); Min Soo Kim, Seoul (KR); Jong Hyun Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/832,456

(22) Filed: Jun. 3, 2022

(65) Prior Publication Data

US 2022/0304167 A1 Sep. 22, 2022

Related U.S. Application Data

(63) Continuation of application No. 16/915,590, filed on Jun. 29, 2020, now Pat. No. 11,357,118.

(30) Foreign Application Priority Data

Nov. 4, 2019 (KR) .................. 10-2019-0139510

(51) Int. Cl.
*H05K 5/00* (2006.01)
*H05K 5/03* (2006.01)

(52) U.S. Cl.
CPC ............. *H05K 5/0017* (2013.01); *H05K 5/03* (2013.01)

(58) Field of Classification Search
None
See application file for complete search history.

(56) References Cited

U.S. PATENT DOCUMENTS

| | | |
|---|---|---|
| 9,430,180 B2 | 8/2016 | Hirakata et al. |
| 9,535,522 B2 | 1/2017 | Ahn |
| 9,766,737 B2 * | 9/2017 | Ahn ................ G09G 3/3208 |

(Continued)

FOREIGN PATENT DOCUMENTS

| | | |
|---|---|---|
| KR | 1020160119914 A | 10/2016 |
| KR | 1020170106558 A | 9/2017 |

(Continued)

OTHER PUBLICATIONS

Extended European Search Report—European Patent Application No. 20193529.3 dated Dec. 17, 2020, citing references listed within.

*Primary Examiner* — Xanthia C Cunningham
(74) *Attorney, Agent, or Firm* — Cantor Colburn LLP

(57) ABSTRACT

A display device includes: a display panel including first and second areas, and a bending portion between the first and second areas; and a cover window on the display panel. The first area is between the cover window and the second area when the display panel is in a bent state, the first bending portion is between the cover window and the third bending portion when the display panel is in the bent state, and the bending portion includes a first bending portion extending from the first area, a second bending portion extending from the first bending portion, and a third bending portion between the second bending portion and the second area. A radius of curvature of the second bending portion is less than that of the first bending portion, and the radius of curvature of the second bending portion is less than that of the third bending portion.

16 Claims, 15 Drawing Sheets

(56) References Cited

U.S. PATENT DOCUMENTS

| | | | |
|---|---|---|---|
| 9,811,120 B2* | 11/2017 | Namkung | G02F 1/133305 |
| 10,228,729 B2* | 3/2019 | Yamazaki | H01L 27/3267 |
| 10,328,664 B2* | 6/2019 | Chu | B32B 27/281 |
| 2014/0042406 A1* | 2/2014 | Degner | H01L 51/0097 |
| | | | 438/34 |
| 2014/0307396 A1* | 10/2014 | Lee | H05K 1/189 |
| | | | 29/830 |
| 2017/0194411 A1* | 7/2017 | Park | H01L 27/3276 |
| 2018/0011514 A1 | 1/2018 | Yoo et al. | |
| 2018/0059728 A1 | 3/2018 | Kim et al. | |
| 2018/0088380 A1* | 3/2018 | Oka | G02F 1/13452 |
| 2018/0178483 A1* | 6/2018 | Chu | B32B 3/02 |
| 2018/0259805 A1 | 9/2018 | Takehara | |

FOREIGN PATENT DOCUMENTS

| | | |
|---|---|---|
| KR | 1020180030276 A | 3/2018 |
| KR | 1020180062274 A | 6/2018 |

* cited by examiner

DISPLAY PANEL AND DISPLAY DEVICE INCLUDING THE SAME

This application is a continuation of U.S. patent application Ser. No. 16/915,590, filed on Jun. 29, 2020, which claims priority to Korean Patent Application No. 10-2019-0139510, filed on Nov. 4, 2019, and all the benefits accruing therefrom under 35 U.S.C. § 119, the content of which in its entirety is herein incorporated by reference.

BACKGROUND

1. Field

The disclosure relates to a display panel and a display device including the display panel.

2. Description of the Related Art

A display device is a device for displaying an image, and typically includes a liquid crystal display ("LCD"), an organic light emitting diode ("OLED") display, or the like. Such a display device is used in various electronic devices such as mobile phones, navigation systems, digital cameras, electronic books, portable game machines, and various terminals.

In a conventional display device, an image is typically displayed on a center portion of a front side. However, in recent years, display devices for displaying images on front edges and display devices for displaying images on side edges, has been developed.

The display device may include a display panel where a plurality of pixels are disposed on a substrate. In order to display an image not only on front edges but also on side edges of the display device, edges of the display panel may be bent. A driving circuit may be installed at one edge of the display device to drive the display panel, and a side surface where the driving circuit is installed may be desired to have a bending structure different from those of other side surfaces.

SUMMARY

Exemplary embodiments provide a display device, in which a display panel is bent to provide a display screen at side surfaces. Such embodiments provide a display device having a structure in which the screen may be provided on side surfaces of the display panel where a driving circuit is installed.

According to an exemplary embodiment, a display device includes: a display panel including a first area, a second area, and a bending portion between the first area and the second area; and a cover window disposed on the display panel, where the first area of the display panel is disposed between the cover window and the second area of the display panel when the display panel is in a bent state. In such an embodiment, the bending portion includes a first bending portion extending from the first area, a second bending portion extending from the first bending portion, and a third bending portion between the second bending portion and the second area, where the first bending portion is disposed between the cover window and the third bending portion when the display panel is in the bent state. In such an embodiment, a radius of curvature of the second bending portion is less than a radius of curvature of the first bending portion, and the radius of curvature of the second bending portion is less than a radius of curvature of the third bending portion.

In an exemplary embodiment, the radius of curvature of the first bending portion may be less than a radius of curvature of a portion of the cover window corresponding thereto.

In an exemplary embodiment, the radius of curvature of the third bending portion may be less than the radius of curvature of the first bending portion.

In an exemplary embodiment, the first bending portion may include an outer surface which faces the cover window and an inner surface which faces the third bending portion, and a radius of curvature of the inner surface may be less than or equal to a radius of curvature of the outer surface.

In an exemplary embodiment, the radius of curvature of the third bending portion may be less than the radius of curvature of the first bending portion.

In an exemplary embodiment, the cover window may cover the first area and the first bending portion.

In an exemplary embodiment, the cover window may not cover at least a part of the second bending portion.

In an exemplary embodiment, a shortest distance to the cover window from a tangent line of the second bending portion that is parallel with the first area may be greater than about 0.1 millimeter (mm) and less than about 1.0 mm.

In an exemplary embodiment, the cover window may cover the first area, the first bending portion, and the second bending portion.

In an exemplary embodiment, a shortest distance to the cover window from a tangent line of the second bending portion which is parallel with the first area may be greater than about zero (0) mm and less than about 1.0 mm.

In an exemplary embodiment, a distance between the first bending portion and the third bending portion may be substantially constant.

In an exemplary embodiment, a distance between the first bending portion and the third bending portion may be gradually decreased or gradually increased as going closer to the second bending portion at a portion adjacent to the second bending portion.

In an exemplary embodiment, the display device may further includes a spacer disposed between the first area and the second area and between the first bending portion and the third bending portion when the display panel is in the bent state, where an opening, which is located at a boundary between the first area and the first bending portion, is defined in the spacer.

In an exemplary embodiment, a planar shape of the opening may include at least one shape selected from a bar shape, a horizontal stripe pattern, a vertical stripe pattern, a lattice pattern, and a dot pattern.

In an exemplary embodiment, the spacer may be further located in a region surrounded by the second bending portion.

In an exemplary embodiment, the display device may further include a support member disposed between the first area and the second area of the display panel and between the first bending portion and the third bending portion when the display panel is in the bent state, where the spacer may be located between the support member and the second area of the display panel and between the support member and the third bending portion.

In an exemplary embodiment, the display device may further include a first protection film disposed between the support member and the first area of the display panel and between the support member and the first bending portion;

and a second protection film disposed between the support member and the second area of the display panel and between the support member and the third bending portion.

In an exemplary embodiment, the second protection film may be disposed between the spacer and the second area of the display panel and between the spacer and the third bending portion.

In an exemplary embodiment, the display device may further include a driving circuit chip disposed on the second area of the display panel.

According to an exemplary embodiment, a display panel includes: a first area and a second area which at least partially overlap each other in a bent state; a first bending portion extending from the first area; a second bending portion extending from the first bending portion; and a third bending portion between the second bending portion and the second area. In such an embodiment, a radius of curvature of the second bending portion is less than a radius of curvature of the first bending portion, and the radius of curvature of the second bending portion is less than a radius of curvature of the third bending portion.

In an exemplary embodiment, the radius of curvature of the third bending portion may be less than the radius of curvature of the first bending portion.

In an exemplary embodiment, the first bending portion may include an inner surface which faces the third bending portion and an outer surface opposite to the inner surface, and a radius of curvature of the inner surface may be less than or equal to a radius of curvature of the outer surface.

According to exemplary embodiments, an edge portion of the display panel include a plurality of bending portions, each having a different radius of curvature such that the screen may be provided at a side surface of the display device.

DETAILED DESCRIPTION

Figure 1:
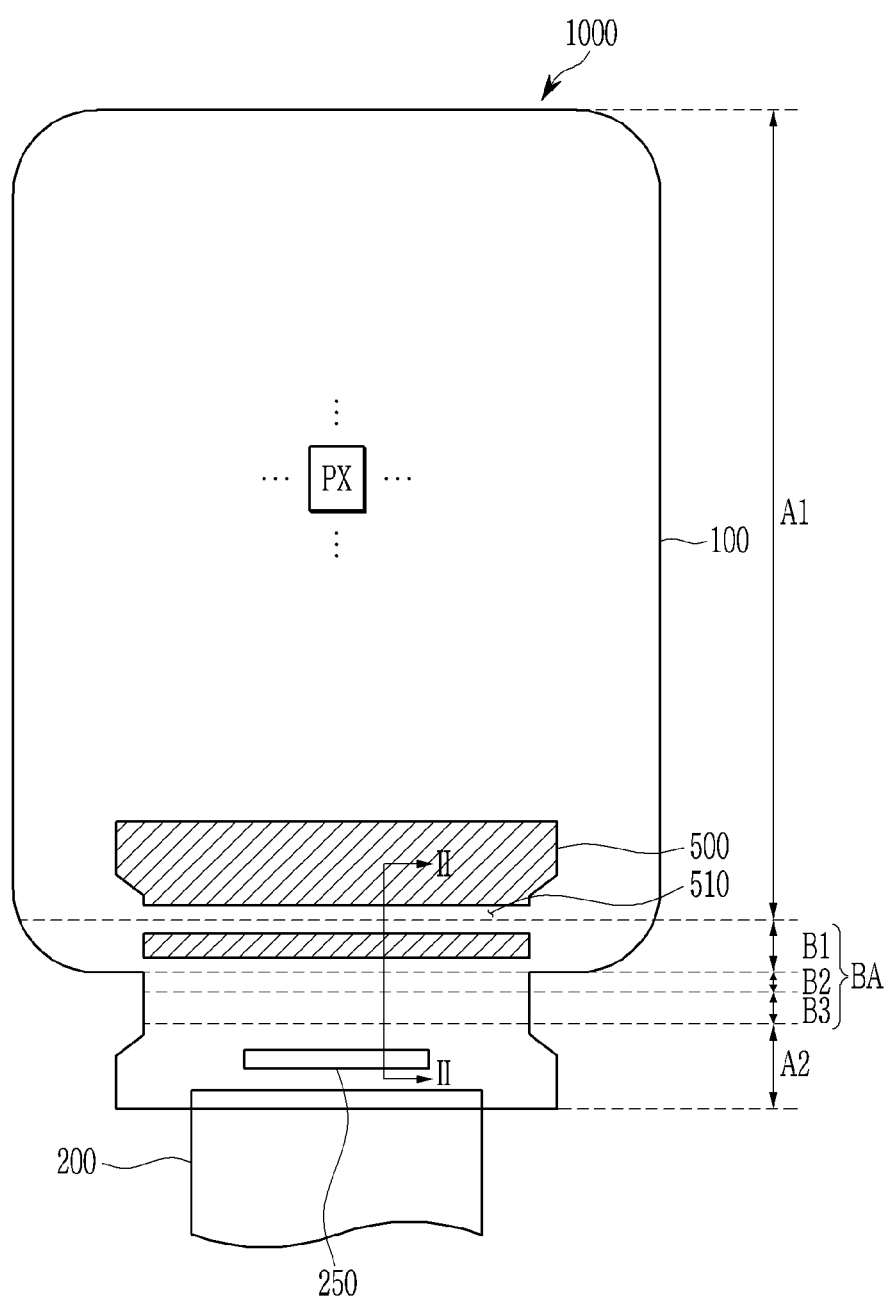
FIG. 1 is a top plan view of a display device according to an exemplary embodiment.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

In addition, since the size and thickness of each configuration shown in the drawing are arbitrarily expressed for better understanding and ease of description, the present invention is not necessarily limited to that shown. In the drawings, the thickness of layers and regions are exaggerated for clarity. In the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, in this specification, the phrase "on a plane" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

First, a display device according to an exemplary embodiment will be described with reference to FIG. 1 to FIG. 4.

Figure 2:
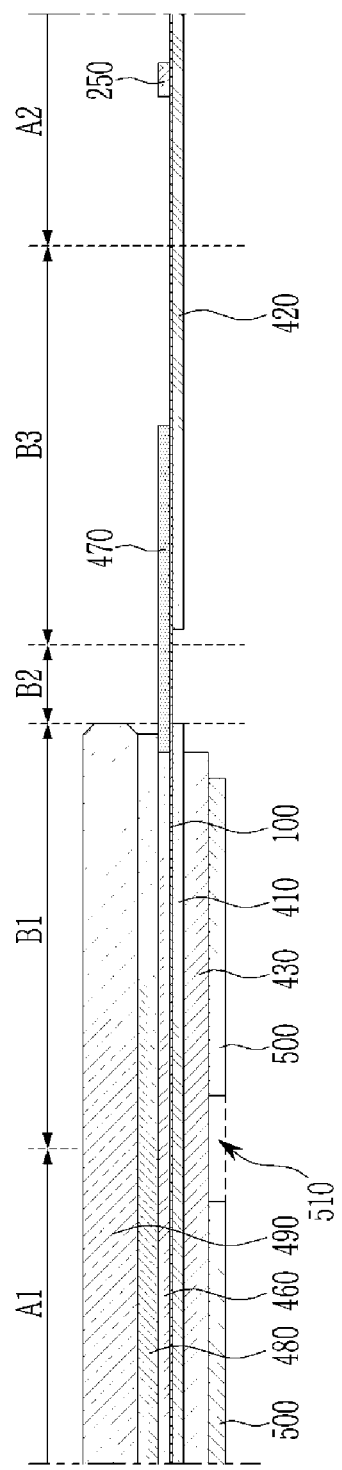
FIG. 2 is a cross-sectional view, taken along line II-II of FIG. 1.
Figure 3:
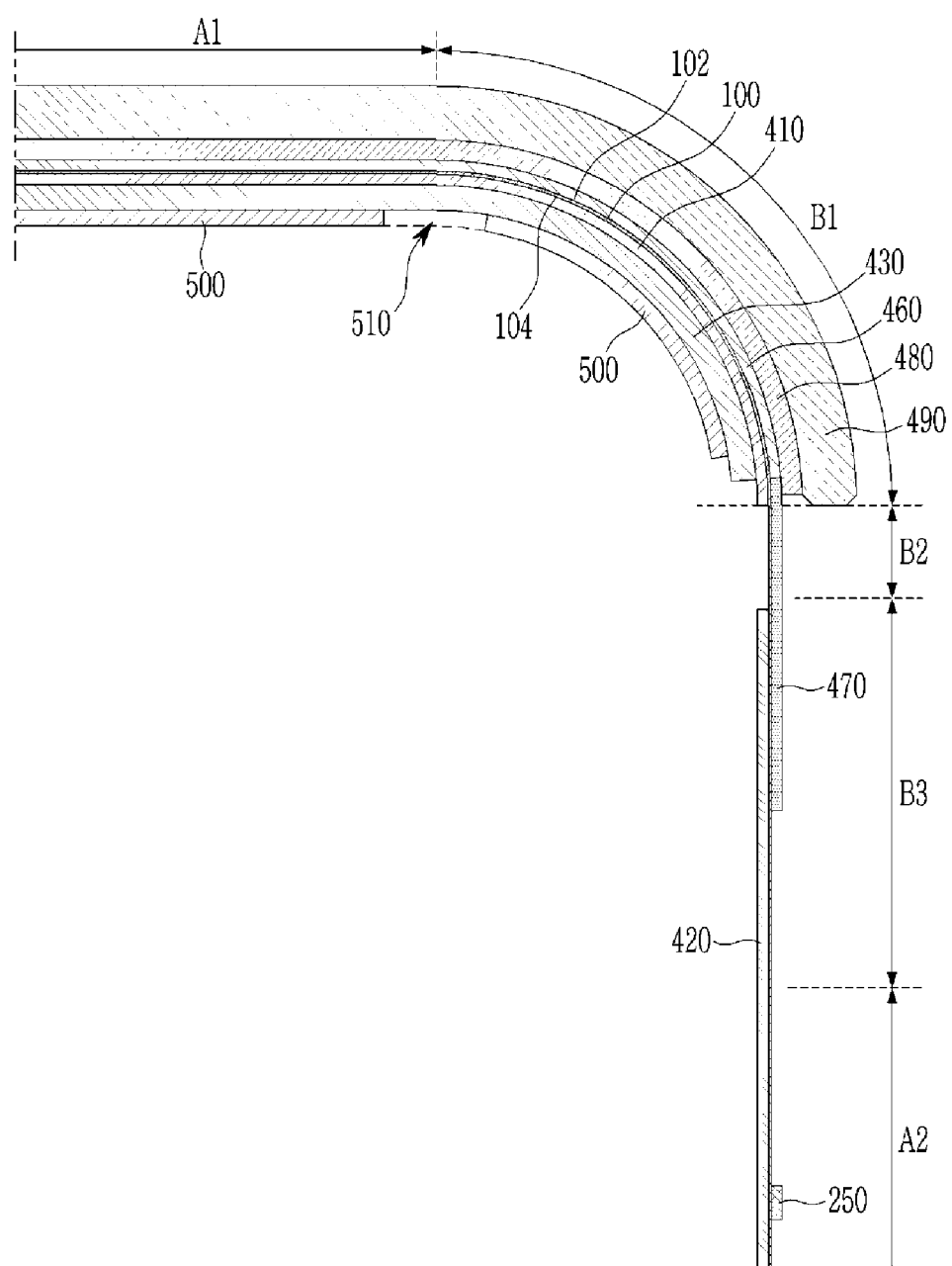
FIG. 3 is a cross-sectional view of the display device of FIG. 2 in a partially bent state.
Figure 4:
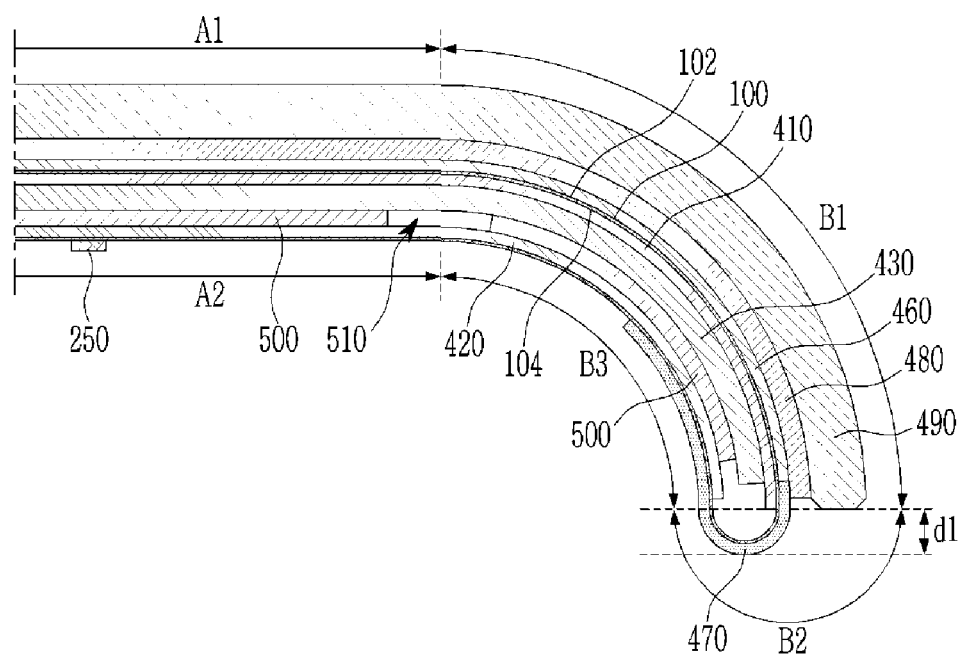
FIG. 4 is a cross-sectional view of the display device of FIG. 2 in a finally bent state.

FIG. 1 is a top plan view of a display device according to an exemplary embodiment, and FIG. 2 is a cross-sectional view, taken along the line II-II of FIG. 1. FIG. 3 is a cross-sectional view of the display device of FIG. 2, in a partially bent state, and FIG. 4 is a cross-sectional view of the display device of FIG. 2, in a finally bent state.

In an exemplary embodiment, as shown in FIG. 1 to FIG. 4, a display device 1000 includes a display panel 100 including a plurality of pixels PX that displays an image, and a cover window 490 disposed on the display panel 100.

The display panel 100 includes a first area A1, a second area A2, and a bending portion BA disposed between and connected to the first area A1 and the second area A2. The display panel 100 may be changed in various shapes by including or being formed of a flexible material. The display panel 100 may be flexible, stretchable, foldable, bendable, or rollable. The bending portion BA is an area in which the display panel 100 is bent, FIG. 1 and FIG. 2 illustrate a state before the display panel 100 is bent or the display panel 100 in an unbent state, FIG. 3 illustrates an intermediate portion in which the display panel 100 is bent, and FIG. 4 illustrates a final state in which the display panel 100 is bent. In an exemplary embodiment, as show in FIG. 4, only the bending portion BA of the display panel 100 is bent, and other areas, excluding the bending portion BA, that is, the first area A1 and the second area A2, may be formed flat or rigid. However, this is merely exemplary, and the display panel 100 may additionally include a bendable area. In one exemplary embodiment, for example, at least a part of the first area A1 or the second area A2 of the display panel 100 may be bent or bendable.

The first area A1 of the display panel 100 is extending to the bending portion BA. The first area A1 may have a rectangular shape including a long side and a short side, and may have a shape having a curved surface with chamfered corners. However, such a shape of the first area A1 is merely exemplary, and the first area A1 may be variously modified to have another shape. Since the plurality of pixels PX are disposed mostly in the first area A1, an image is disposed on the first area A1. However, no pixel PX may be disposed in a part of an edge area of the first area A1, and no image may be displayed thereon. In one exemplary embodiment, for example, only a lower edge of the first area A1 is extending to the bending portion BA as shown in FIG. 1 to FIG. 4. Alternatively, an upper edge, a left edge, or an right edge of the first area A1 may be bent, and at least a part of the bent portions may display a screen.

In an exemplary embodiment, the plurality of pixels PX may be arranged in a matrix format, and may receive an image signal and display an image based on the image signal. In such an embodiment, the alignment format of the plurality of pixels PX may be variously modified. Although it is not illustrated, the display panel 100 may further include a plurality of signal lines. The signal lines may include a plurality of scan lines, a plurality of control lines, a plurality of data lines, a plurality of driving voltage lines, and the like. The signal lines may respectively transmit a scan signal, a control signal, a data signal, a driving voltage, and the like. The plurality of signal lines may be disposed to cross each other in a row direction or a column direction. In an exemplary embodiment, each pixel PX may include a plurality of transistors connected to the plurality of signal lines, a capacitor, and a light emitting element, e.g., a light emitting diode ("LED"). In such an embodiment, the display panel 100 may be an organic light emitting display panel. However, the type of the display panel 100 is not limited thereto, and may be provided as various types of panels. In one exemplary embodiment, for example, the display panel 100 may be a liquid crystal panel, an electrophoretic display panel, an electrowetting display panel, or the like.

The second area A2 of the display panel 100 is extending to the bending portion BA. The second area A2 is a non-display area where no image is displayed, and does not include pixels PX. Elements and/or wires that generate and/or transmit various signals applied to the pixels PX are disposed in the second area A2.

A driving circuit chip 250 and a flexible circuit board 200 may be disposed on the display panel 100. The driving circuit chip 250 is connected to the elements or the wires disposed in the second area A2 to transmit various signals to the pixels PX disposed in the display panel 100. In one exemplary embodiment, for example, the driving circuit chip 250 may supply a scan signal, a control signal, a data signal, and the like. The flexible circuit board 200 may be attached to an edge of the second area A2 of the display panel 100. The flexible circuit board 200 may include or be formed of a flexible material. A circuit for controlling driving of the display panel 100 is disposed in the flexible circuit board 200.

The bending area BA of the display panel 100 is disposed between the first area A1 and the second area A2 and establishes a connection therebetween. The first area A1 and the second area A2 overlap each other while the display panel 100 is in a bent state. The bending portion BA of the display panel 100 may be located to be connected to one short side of the first area A1. However, the location of the bending portion BA is merely exemplary, and may be variously modified. In one exemplary embodiment, for example, the bending portion BA may be located to be connected to both short sides of the first area A1 or a long side of the first area A1.

The bending portion BA of the display panel 100 includes a first bending portion B1 extending from the first area A1, a second bending portion B2 extending from the first bending portion B1, and a third bending portion B3 between the second bending portion B2 and the second area A2.

The first bending portion B1 of the display panel 100 is bent with a predetermined radius of curvature. One edge of the first bending portion B1 of the display panel 100 is extending to the first area A1, and another edge of the first bending portion B1 is extending to the second bending portion B2. The first bending portion B1 of the display panel 100 may have a width that is similar to or substantially the same as that of one short side of the first area A1. In an exemplary embodiment, the width of the first bending portion B1 may have be gradually reduced when moving away from the first area A1. However, this is merely exemplary, and the shape of the first bending portion B1 may be variously modified. The first bending portion B1 of the display panel 100 may include pixels PX that display an image. An entire area of the first bending portion B1 may include pixels PX and thus may display an image. However, this is merely exemplary, and some area of the first bending portion B1 includes pixels PX, and other areas may not include pixels PX. In one exemplary embodiment, for example, a portion of the first bending portion B1, located adjacent to the first area A1 of the display panel 100, may include pixels PX, and a portion of the first bending portion B1, located adjacent to the second bending portion B2 of the display panel 100, may not include pixels PX. In such an embodiment, a ratio of the area that includes the pixels PX in the entire area of the first bending portion B1 may be variously changed. In one exemplary embodiment, for example, a ratio of the area that includes the pixels PX in the entire area of the first bending portion B1 may be in a range of about 50% or about 70%.

The second bending portion B2 of the display panel 100 may be bent with a predetermined radius of curvature. The radius of curvature of the second bending portion B2 of the display panel 100 may be different from that of the first bending portion B1

One edge of the second bending portion B2 of the display panel 100 is connected to the first bending portion B1, and another edge of the second bending portion B2 is connected to the third bending portion B3. A width of the second bending portion B2 of the display panel 100 may be less than a width of the edge of the first bending portion B1, connected to the second bending portion B2. However, this is merely exemplary, and the width of the second bending portion B2 of the display panel 100 may be substantially the same as that of the first bending portion B1. The second bending portion B2 may not include pixels PX that display an image. However, this is merely exemplary, and at least a part of the second bending portion B2 may include pixels PX.

In an exemplary embodiment, the third bending portion B3 of the display panel 100 is bent with a predetermined radius of curvature. The radius of curvature of the third bending portion B3 of the display panel 100 may be different from that of the second bending portion B2. In such an embodiment, the radius of curvature of the third bending portion B3 of the display panel 100 may be different from that of the second bending portion B2. One edge of the third bending portion B3 of the display panel 100 is connected to the second bending portion B2, and another edge of the third bending portion B3 is connected to the second area A2. A width of the third bending portion B3 of the display panel 100 may be similar to or substantially the same as the width of the second bending portion B2. However, this is merely exemplary, and the width of the third bending portion B3 may be different from the width of the second bending portion B2.

In an exemplary embodiment, as shown in FIG. 4, each of the first bending portion B1, the second bending portion B2, and the third bending portion B3 of the display panel 100 is bent with a predetermined radius of curvature. The radius of curvature of the first bending portion B1 is similar to or substantially the same as that of the third bending portion B3. The radius of curvature of the second bending portion B2 is less than the radius of curvature of the first bending portion B1 and the radius of curvature of the second bending portion B2 is less than the radius of curvature of the third bending portion B3. The first bending portion B1 of the display panel 100 is bent downward with respect to the first area A1. The first bending portion B1 is shaped like an arc with a central angle of approximately 90 degrees. The second bending portion B2 of the display panel 100 is bent in the lateral direction with respect to the first bending portion B1. The second bending portion B2 is shaped like an arc with a central angle of approximately 180 degrees. The third bending portion B3 of the display panel 100 is bent upward with respect to the second bending portion B2. The third bending portion B3 is shaped like an arc with a central angle of approximately 90 degrees.

The radius of curvature of the second bending portion B2 may be substantially similar to or substantially the same as half the distance between the first bending portion B1 and the third bending portion B3. The distance between the first bending portion B1 and the third bending portion B3 may be substantially constant. In one exemplary embodiment, for example, where the distance between the first bending portion B1 and the third bending portion B3 is about 1 millimeter (mm), the radius of curvature of the second bending portion B2 may be about 0.5 mm.

In an exemplary embodiment, while the display panel 100 is in a bent state, the first bending portion B1 and the third bending portion B3 overlap each other, and the third bending portion B3 is located at an inner side of the first bending portion B1. In such an embodiment, the radius of curvature of the third bending portion B3 may be less than that of the first bending portion B1. The distance between the first bending portion B1 and the third bending portion B3 may be substantially constant. A difference between the radius of curvature of the first bending portion B1 and the third bending portion B3 may be substantially the same or similar to or substantially the same as the distance between the first bending portion B1 and the third bending portion B3. In one exemplary embodiment, for example, where the distance between the first bending portion B1 and the third bending portion B3 is about 1 mm, the radius of curvature of the first bending portion B1 may be about 4 mm and the radius of curvature of the third bending portion B3 may be about 3 mm.

The first bending portion B1 of the display panel 100 may include an outer surface 102 that faces the cover window 490 and an inner surface 104 that faces the third bending portion B3. In such an embodiment, a radius of curvature of the inner surface 104 of the first bending portion B1 of the display panel 100 may be less than a radius of curvature of the outer surface 102 of the first bending portion B1 of the display panel 100. A radius of curvature difference between the outer surface 102 and the inner surface 104 of the first bending portion B1 may be substantially similar to or substantially the same as a thickness of the display panel 100. In an exemplary embodiment, the thickness of the display panel 100 may be substantially thin, e.g., in a range of about 20 micrometers (μm) to about 30 μm, and the radius of curvature of the inner surface 104 of the first bending portion B1 of the display panel 100 may be substantially the same as that of the outer surface 102 of the first bending portion B1 of the display panel 100. Thus, the radius of curvature of the inner surface 104 of the first bending portion B1 of the display panel 100 may be less than or equal to the radius of curvature of the outer surface 102 of the first bending portion B1 of the display panel 100.

In an exemplary embodiment, as described above, the display panel 100 of the display device 1000 has at least one bent edge, and in such an embodiment, the bending portion BA includes the first bending portion B1, the second bending portion B2, and the third bending portion B3, which have different radius of curvatures from each other, such that a structure in which the screen is disposed even at an edge surface of the display device 1000 may be easily implemented. At least a part of the first bending portion B1 may include pixels PX that display an image. The third bending portion B3 overlaps the first bending portion B1 and is located at an inner side of the first bending portion B1, and a driving circuit chip 250 may be located on the second area A2 that is connected to the third bending portion B3.

The cover window 490 may be located on one surface of the display panel 100. The cover window 490 serves to protect the display panel 100 from external interference. The cover window 490 may overlap the first area A1 of the display panel 100. The cover window 490 may overlap the entire first area A1 of the display panel 100. Since the first area A1 and the second area A2 of the display panel 100 overlap while the display panel 100 is in a bent state, the cover window 490 overlaps the first area A1 and the second area A2. While the display panel 100 is in the bent state, the first area A1 of the display panel 100 is disposed between the cover window 490 and the second area A2 of the display panel 100. The shape of the cover window 490 is similar to or substantially the same as the shape of the display panel 100. A portion of the cover window 490, overlapping the first area A1 of the display panel 100, may be flat.

The cover window 490 may overlap the bending portion BA of the display panel 100. The cover window 490 may overlap the first bending portion B1 of the display panel 100. Since the first bending portion B1 and the third bending portion B3 of the display panel 100 overlap while the display panel 100 is in the bent state, the cover window 490 overlaps the first bending portion B1 and the third bending portion B3. While the display panel 100 is in the bent state, the first bending portion B1 of the display panel 100 is disposed between the cover window 490 and the third bending portion B3. The shape of the cover window 490 is similar to or substantially the same as the shape of the display panel 100. A portion of the cover window 490, overlapping the bending portion BA of the display panel 100, may have a bent shape. In such an embodiment, the radius of curvature of the first bending portion B1 of the display panel 100 may be less than that of the cover window 490. Here, the radius of curvature of the cover window 490 may be a radius of curvature of the portion thereof having the bent shape. A radius of curvature difference between the first bending portion B1 of the display panel 100 and the cover window 490 may be similar to or substantially the same as a gap between the first bending portion B1 of the display panel 100 and the cover window 490. Here, the radius of curvature of the cover window 490 means a radius of curvature of the outer surface of the cover window 490. Here, the gap between the first bending portion B1 of the display panel 100 and the cover window 490 means a distance from the first bending portion B1 of the display panel 100 to the outer surface of the cover window 490. In one exemplary embodiment, for example, where the distance between the first bending portion B1 of the display panel 100 and the cover window 490 is about 0.5 mm, the radius of curvature of the first bending portion B1 of the display panel 100 may be about 4 mm and the radius of curvature of the cover window 490 may be about 4.5 mm.

The cover window 490 may not overlap at least a part of the second bending portion B2 of the display panel 100. in an exemplary embodiment, as shown in FIG. 2 to FIG. 4, the cover window 490 does not overlap the second bending portion B2 of the display panel 100. However, this is merely exemplary, and alternatively, the cover window 490 overlaps a part of the second bending portion B2 of the display panel 100 and may not overlap the remaining part of the second bending portion B2. In such an embodiment, a shortest distance d1 from the tangent line of the second bending portion B2 that is parallel to the first area A1 of the display panel 100 to the cover window 490 may be greater than or equal to about 0.1 mm and less than or equal to about 1.0 mm, but not being limited thereto.

Hereinafter, a structure of an exemplary embodiment of the display device including a chassis to protect a portion of the display panel 100, not covered by the cover window 490, will be described in detail.

Figure 5:
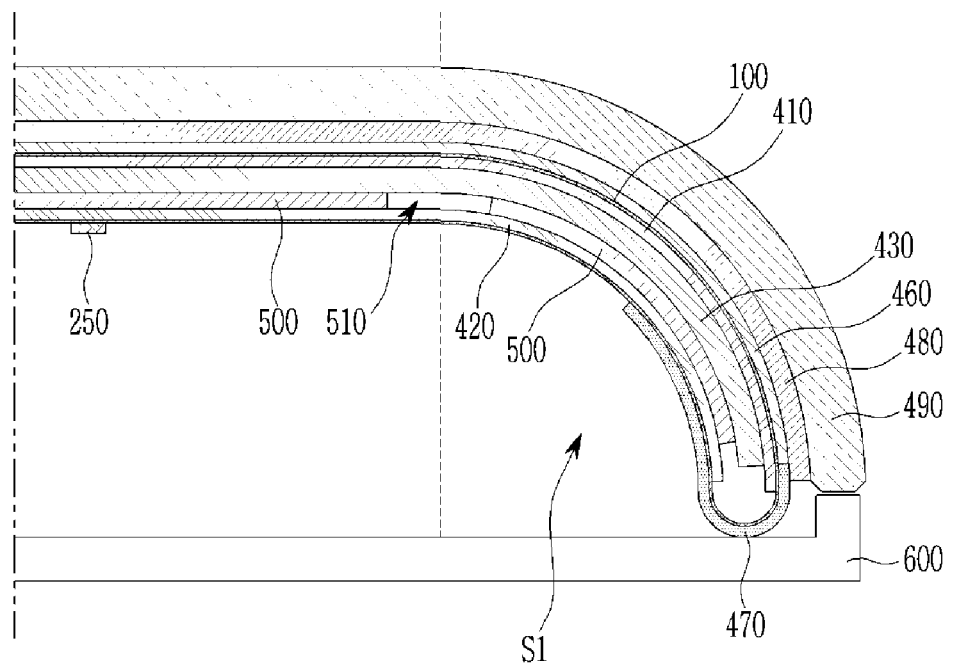
FIG. 5 is a cross-sectional view of the display device according to an exemplary embodiment.
Figure 6:
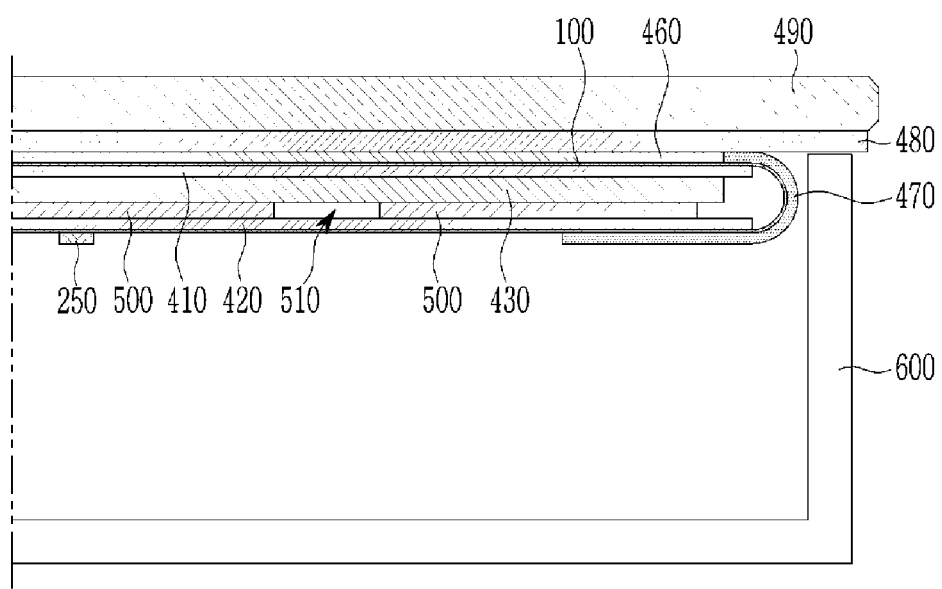
FIG. 6 is a cross-sectional view of a display device according to a comparative example.

FIG. 5 is a cross-sectional view of the display device according to an exemplary embodiment, and FIG. 6 is a cross-sectional view of a display device according to a comparative example.

In an exemplary embodiment, as shown in FIG. 5, the display device 1000 may further include a chassis 600 that is disposed below the display panel 100. The chassis 600 is disposed to cover a lower portion and a part of a side surface of the display panel to protect the display panel 100 and constituent elements of the display device 1000, provided between the display panel 100 and the chassis 600. The chassis 600 may cover a portion of the display panel 100 not covered by the cover window 490. Thus, the portion of the display panel 100 not covered by the cover window 490 may be protected by the chassis 600. Accordingly, a structure in which the cover window 490 does not cover a part of the display panel 100 may be implemented. Thus, a ratio of the cover window 490 to a portion of the display device 1000 for displaying an image may be reduced. In such an embodiment, other constituent elements may be located or accommodated in a space S1 defined by the bending portion of the display panel 100 and the chassis 600.

Hereinafter, a comparative example will be described with reference to FIG. 6. As shown in FIG. 6, a conventional display device may include a single bending portion at an edge thereof. A chassis 600 is disposed to cover a lower portion and a side surface of a display panel 100. In such a structure, a cover window 490 is desired to be formed to cover the entire display panel 100 to protect the display panel 100. Thus, a ratio of the cover window 490 to a portion of the display device 1000 for displaying an image is relatively great.

Referring back to FIG. 1 to FIG. 5, an exemplary embodiment of the display device will be described in detail.

An adhesive layer 480 may be disposed between the display panel 100 and the cover window 490. The adhesive layer 480 may include or be formed of an optically clear adhesive ("OCA"), an optically clear resin ("OCR"), a pressure sensitive adhesive ("PSA"), or the like. The adhesive layer 480 serves to bond between the display panel 100 and the cover window 490.

A first protection film 410 and a second protection film 420 may be further disposed or provided on a surface of the display panel 100. The first protection film 410 may be located on or to overlap the first area B1 and the first bending portion B1 of the display panel 100. The second protection film 420 may be located on or to overlap the second area A2 and the third bending portion B3 of the display panel 100. The display panel 100 includes or is formed of a flexible material, and has a substantially thin thickness. In an exemplary embodiment, the first protection film 410 may be attached to the first area A1 and the first bending portion B1 of the display panel 100 to maintain a shape of the first area A1 and the second bending portion B1 of the display panel 100. In an exemplary embodiment, the second protection film 420 may be attached to the second area A2 and the third bending portion B3 of the display panel 100 to maintain a shape of the second area A2 and the third bending portion B3 of the display panel 100. The first protection film 410 and the second protection film 420 may include or be formed of a polymer such as polyethylene terephthalate, polyethylene naphthalate, polyimide, polyethylene sulfide, or the like, but not being limited thereto. Each of the first protection film 410 and the second protection film 420 may have a thickness in a range of about 50 μm and about 150 μm, but not being limited thereto.

In an exemplary embodiment, although not illustrated, an adhesive layer may be further provided between the first protection film 410 and the first area A1 of the display panel, and between the first protection film 410 and the first bending portion B1 of the display panel 100, to improve adherence between the first protection film 410 and the display panel 100. In an exemplary embodiment, an adhesive layer may be further provided between the second protection film 420 and the second area A2 of the display panel 100 and between the second protection film 420 and the third bending portion B3 of the display panel 100 to improve adherence between the second protection film 420 and the display panel 100.

In an exemplary embodiment, since the radius of curvature of the second bending portion B2 of the display panel 100 is less than those of the first and third bending portions B1 and B3, the first protection film 410 and the second protection film 420 may not be disposed on the second bending portion B2 of the display panel 100 such that the second bending portion B2 may be effectively or smoothly bent. In such an embodiment, a bending portion protection film 470 may be provided on the second bending portion B2 of the display panel 100 to protect the second bending portion B2 of the display panel 100. In an exemplary embodiment, although not illustrated, an adhesive layer may be further provided between the second bending portion B2 of the display panel 100 and the bending portion protection film 470 to improve adherence between the second bending portion B2 and the bending portion protection film 470.

In an exemplary embodiment, the bending portion protection film 470 may be further located not only on the second bending portion B2 of the display panel 100 but also on the first bending portion B1 and the third bending portion B3. The bending portion protection film 470 and the first protection film 410 may overlap each other. In an exemplary embodiment, the bending portion protection film 470 and the second protection film 420 may overlap each other. In such an embodiment, the bending portion protection film 470 and the first protection film 410 are located on different sides of the display panel 100. In such an embodiment, the bending portion protection film 470 and the second protection film 420 are located on different sides of the display panel 100. In one exemplary embodiment, for example, when the display panel 100 is in an unbent state or a flat state as shown in FIG. 2, the first protection film 410 and the second protection film 420 may be located on a lower surface of the display panel 100. In such an embodiment, as shown in FIG. 2, the bending portion protection film 470 may be located on an upper surface of the display panel 100. While the display panel 100 is in a bent state, as shown in FIG. 4, the first protection film 410 and the second protection film 420 may be located in an inner side of the display panel 100. The first area A1 and the second area A2 overlap each other in a state where the display panel 100 is bent. In such an embodiment, the first protection film 410 and the second protection film 420 overlap each other when the display panel 100 is in the bent state. In such an embodiment, the bending portion protection film 470 is located on an outer side of the display panel 100 when the display panel 100 is in the bent state.

In an exemplary embodiment, a support member 430 may be further provided on one surface of the display panel 100. The support member 430 may be disposed on or to overlap the first area A1 and the first bending portion B1 of the display panel 100. The first protection film 410 may be disposed between the first area A1 of the display panel 100 and the support member 430, and between the first bending portion B1 of the display panel 100 and the support member 430. In such an embodiment, the first area A1 of the display panel 100, the first protection film 410, and the support member 430 may overlap each other. In such an embodiment, the first bending portion B1 of the display panel 100, the first protection film 410, and the support member 430 may overlap each other. The support member 430 serves to maintain the display panel 100 at a predetermined shape, together with the first protection film 410.

When the display panel 100 is in the bent state, the support member 430 is disposed between the first protection film 410 and the second protection film 420. In an exemplary embodiment, although it is not illustrated, an adhesive layer may be further provided between the support member 430 and the first protection film 410 to improve adherence between the support member 430 and the first protection film 410.

A spacer 500 may be further located on one surface of the display panel 100. The spacer 500 may be located on an edge of the first area A1 and the first bending portion B1 of the display panel 100. When the display panel 100 is in the bent state, the spacer 500 overlaps the first area A1 and the second area A2 of the display panel 100. In an exemplary embodiment, the spacer 500 is disposed between the first area A1 and the second area A2 of the display panel 100 when the display panel 100 is in the bent state, and may serve to maintain a constant gap between the first area A1 and the second area A2. In such an embodiment, the second protection film 420 may be disposed between the spacer 500 and the second area A2 of the display panel 100. In such an embodiment, the spacer 500 overlaps the first bending portion B1 and the third bending portion B3 of the display panel 100. In such an embodiment, the spacer 500 is disposed between the first bending portion B1 and the third bending portion B3 of the display panel 100 to maintain a constant gap between the first bending portion B1 and the third bending portion of the display panel 100. The second protection film 420 may be disposed between the spacer 500 and the third bending portion B3 of the display panel 100.

In an exemplary embodiment, as shown in FIG. 5, the spacer 500 may not be located on the second bending portion B2. In such an embodiment, the spacer 500 may not be located on a portion of the first bending portion B1, adjacent to the second bending portion B2.

Since the spacer 500 serves to maintain a constant gap between the first area A1 and the second area A2 while the display panel 100 is in a bent state, a planar shape of the spacer 500 may be determined based on a planar shape of a portion where the first area A1 and the second area A2 overlap each other. In such an embodiment, since the spacer 500 serves to maintain a constant gap between the first area A1 and the third area A3 while the display panel 100 is in a bent state, a planar shape of the spacer 500 may be determined based on a planar shape of a portion where the first area A1 and the third area A3 overlap each other. In one exemplary embodiment, for example, a planar shape of the spacer 500 may be substantially similar to or substantially the same as those of the second and third areas A2 and S3.

In an exemplary embodiment, an opening 510 may be defined in the spacer 500. The opening 510 may be located at a boundary between the first area A1 and the first bending portion B1. When the display panel 100 is in the bent state, a boundary between the first area A1 and the first bending portion B1 may substantially match a boundary between the second area A2 and the third bending portion B3. Thus, the opening 510 is located at the boundary between the second area A2 and the third bending portion B3. The opening 510 may be located not only at the boundary between the first area A1 and the first bonding portion B1 and the boundary between the second area A2 and the third bending portion B3, but also at the periphery thereof. The boundary between the first area A1 and the first bonding portion B1 and the boundary between the second area A2 and the third bending portion B3 are portions where a bending process of the display panel 100 is performed, and the bending process may be easily performed by forming the opening 510 in the corresponding area first area A1. A planar shape of the opening 510 may be a bar shape. However, this is merely exemplary, and the planar shape of the opening 510 may be variously modified.

In an exemplary embodiment, an optical layer 460 may be further located on one surface of the display panel 100. The optical layer 460 may be disposed between the display panel 100 and the cover window 490. In such an embodiment, the adhesive layer 480 may be disposed between the optical layer 460 and the cover window 490. The optical layer 460 may overlap the first area A1 and the first bending portion B1 of the display panel 100. While the display panel 100 is in the bending state, the optical layer 460 may overlap the first area A1, the second area A2, the first bending portion B1, and the third bending portion B3 of the display panel 100. The optical layer 460 may be embedded in the display or 100. The optical layer 460 may include a phase delay layer, a polarizer layer, and the like. The optical layer 460 may have a single layer structure or a multi-layer structure in which a plurality of layers are stacked one on another.

Next, a display device according to an alternative exemplary embodiment will be described.

Figure 7:
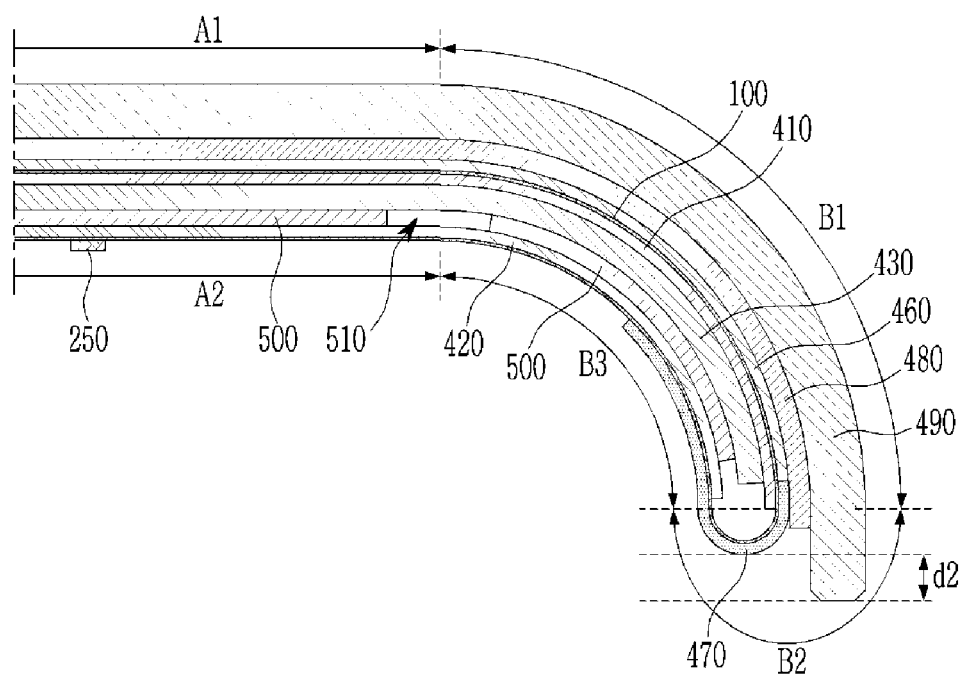
FIG. 7 is a cross-sectional view of a display device according to an alternative exemplary embodiment.

An exemplary embodiment of a display device shown in FIG. 7 is substantially the same as the exemplary embodiments of the display device described above with reference to FIG. 1 to FIG. 4 except that a cover window 490 covers up to a second bending portion B2. The same or like elements shown in FIG. 7 have been labeled with the same reference characters as used above to describe the exemplary embodiments of the display device shown in FIG. 1 to FIG. 4, and any repetitive detailed description thereof will hereinafter be omitted or simplified.

FIG. 7 is a cross-sectional view of a display device according to an alternative exemplary embodiment. FIG. 7 shows an exemplary embodiment of a display panel is in a bent state.

In an exemplary embodiment, as shown in FIG. 7, a display device includes a display panel 100 including a first area A1, a second area A2, and a bending portion BA, and a cover window 490 disposed on the display panel 100. The bending portion BA includes a first bending portion B1, a second bending portion B2, and a third bending portion B3, each bent with a predetermined radius of curvature.

In an exemplary embodiment, as shown in FIG. 4, the cover window 490 overlaps the first area A1 and the second area A2 of the display panel 100, and overlaps the first bending portion B1 and the third bending portion B3. In such an embodiment, the cover window 490 does not overlap at least a part of the second bending portion B2 of the display panel 100. In an alternative exemplary embodiment, as shown in FIG. 7, the cover window 490 overlaps the first area A1 and the second area A2 of the display panel 100, and overlaps the first bending portion B1 and the third bending portion B3. In such an embodiment, the cover window 490 may also overlap the second bending portion B2 of the display panel 100. In such an embodiment, the cover window 490 may cover not only the first area A1, the second area A2, the first bending portion B1, and the third bending portion B3 of the display panel 100, but also up to the second bending portion B2. The cover window 490 may cover the entire second bending portion B2. In such an embodiment, the cover window 490 may cover a space that is located at a lower side of the second bending portion B2. A shortest distance d2 from the tangent line of the second bending portion B2 that is parallel to the first area A1 of the display panel 100 to the cover window 490 may be greater than or equal to about zero (0) mm and less than or equal to about 1.0 mm, but not being limited thereto.

Next, a display device according to another alternative exemplary embodiment will be described with reference to FIG. 8.

Figure 8:
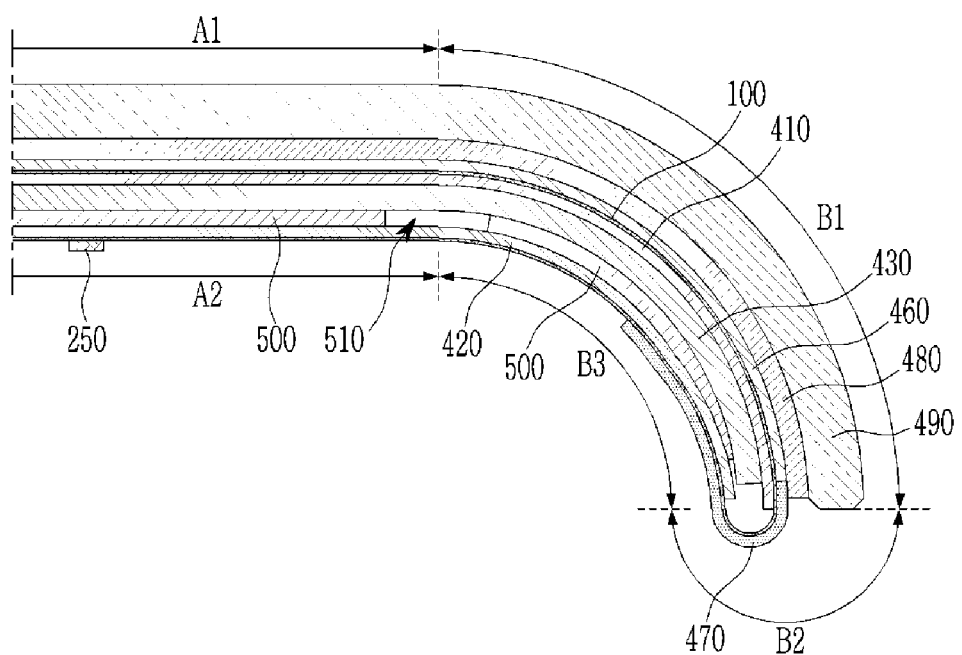
FIG. 8 is a cross-sectional view of the display device according to another alternative exemplary embodiment.

An exemplary embodiment of a display device shown in FIG. 8 is substantially the same as the exemplary embodiments of the display device described above with reference to FIG. 1 to FIG. 4, except that a distance between a first bending portion B1 and a third bending portion B3 of a display panel 100 is irregular. The same or like elements shown in FIG. 8 have been labeled with the same reference characters as used above to describe the exemplary embodiments of the display device shown in FIG. 1 to FIG. 4, and any repetitive detailed description thereof will hereinafter be omitted or simplified.

FIG. 8 is a cross-sectional view of the display device according to another alternative exemplary embodiment. FIG. 8 shows an exemplary embodiment of the display device in a bent state.

In an exemplar embodiment, a display device includes a display panel 100 including a first area A1, a second area A2, and a bending portion BA, and a cover window 490 located on the display panel 100. The bending portion BA includes a first bending portion B1, a second bending portion B2, and a third bending portion B3, each bent with a predetermined radius of curvature.

In an exemplary embodiment, as shown in FIG. 4, a distance between the first bending portion B1 and the third bending portion B3 of the display panel 100 may be substantially constant. In an alternative exemplary embodiment, as shown in FIG. 8, a distance between the first bending portion B1 and the third bending portion B3 of the display panel 100 is at least partially irregular. A distance between the first bending portion B1 and the third bending portion B3 may be constant in a portion that is adjacent to the first area A1 and the second area A2 of the display panel 100. A distance between the first bending portion B1 and the third bending portion B3 may not be constant in a portion that is adjacent to the second bending portion B2 of the display panel 100. In such an embodiment, a distance between the first bending portion B1 and the third bending portion B3 in the portion adjacent to the second bending portion B2 of the display panel 100 may be gradually reduced as going closer to the second bending portion B2. In such an embodiment, a constant distance between the first bending portion B1 and the third bending portion B3 is maintained, and then the distance may be gradually reduced as going closer to the second bending portion B2 from the portion adjacent to the second bending portion B2.

In such an embodiment, the radius of curvature of the second bending portion B2 is similar to or substantially the same as half a shortest distance between the first bending portion B1 and the third bending portion B3. In such an embodiment, the radius of curvature of the second bending portion B2 is similar to or substantially the same as half the distance between the first bending portion B1 and the third bending portion B3 at a location adjacent to the second bending portion B2.

Next, a display device according to another alternative exemplary embodiment will be described with reference to FIG. 9.

Figure 9:
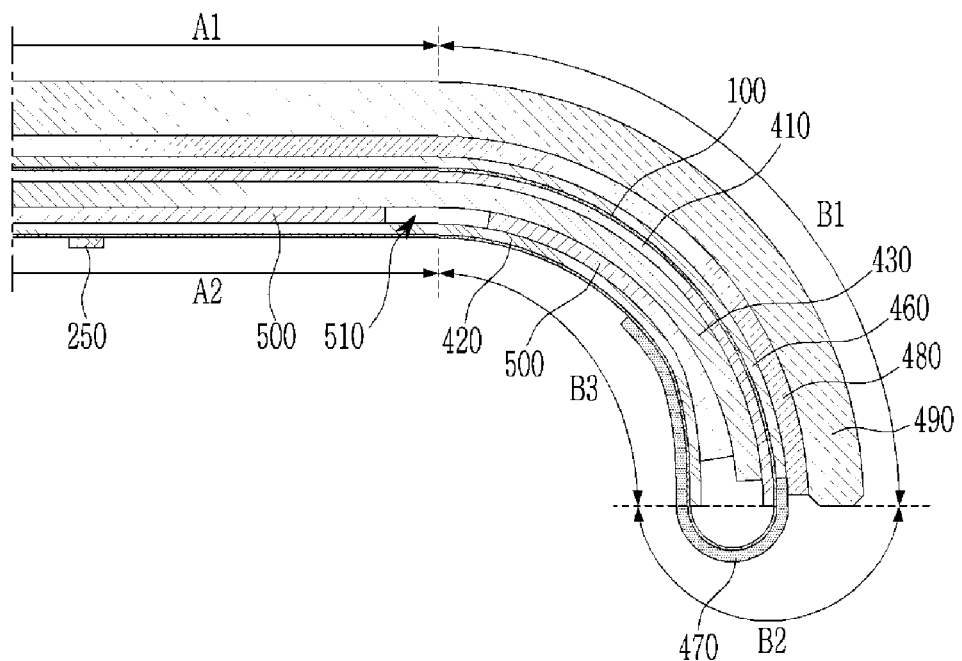
FIG. 9 is a cross-sectional view of the display device according to an exemplary embodiment.

An exemplary embodiment of a display device shown in FIG. 9 is substantially the same as the exemplary embodiments of the display device described above with reference to FIG. 1 to FIG. 4 except that a distance between a first bending portion B1 and a third bending portion B3 of a display panel 100 is irregular. The same or like elements shown in FIG. 9 have been labeled with the same reference characters as used above to describe the exemplary embodiments of the display device shown in FIG. 1 to FIG. 4, and any repetitive detailed description thereof will hereinafter be omitted or simplified.

FIG. 9 is a cross-sectional view of the display device according to another alternative exemplary embodiment. FIG. 9 shows an exemplary embodiment of the display device in a bent state.

In an exemplary embodiment, a display device includes a display panel 100 including a first area A1, a second area A2, and a bending portion BA, and a cover window 490 located on the display panel 100. The bending portion BA includes a first bending portion B1, a second bending portion B2, and a third bending portion B3, each bent with a predetermined radius of curvature.

In an exemplary embodiment, as shown in FIG. 4, a distance between the first bending portion B1 and the third bending portion B3 of the display panel 100 may be substantially constant. In an alternative exemplary embodiment, a distance between the first bending portion B1 and the third bending portion B3 of the display panel 100 is at least partially irregular. A distance between the first bending portion B1 and the third bending portion B3 may be constant in a portion that is adjacent to the first area A1 and the second area A2 of the display panel 100. A distance between the first bending portion B1 and the third bending portion B3 may not be constant in a portion that is adjacent to the second bending portion B2 of the display panel 100. In such an embodiment, a distance between the first bending portion B1 and the third bending portion B3 in the portion adjacent to the second bending portion B2 of the display panel 100 may be gradually increased as going closer to the second bending portion B2. In such an embodiment, a constant distance between the first bending portion B1 and the third bending portion B3 is maintained, and then the distance may be gradually increased as going closer to the second bending portion B2 from the portion adjacent to the second bending portion B2.

In such an embodiment, the radius of curvature of the second bending portion B2 is similar to or substantially the same as half a shortest distance between the first bending portion B1 and the third bending portion B3. In such an embodiment, the radius of curvature of the second bending portion B2 is similar to or substantially the same as half the distance between the first bending portion B1 and the third bending portion B3 at a location adjacent to the second bending portion B2.

Next, a display device according to another alternative exemplary embodiment will be described with reference to FIG. 10 and FIG. 11.

Figure 10:
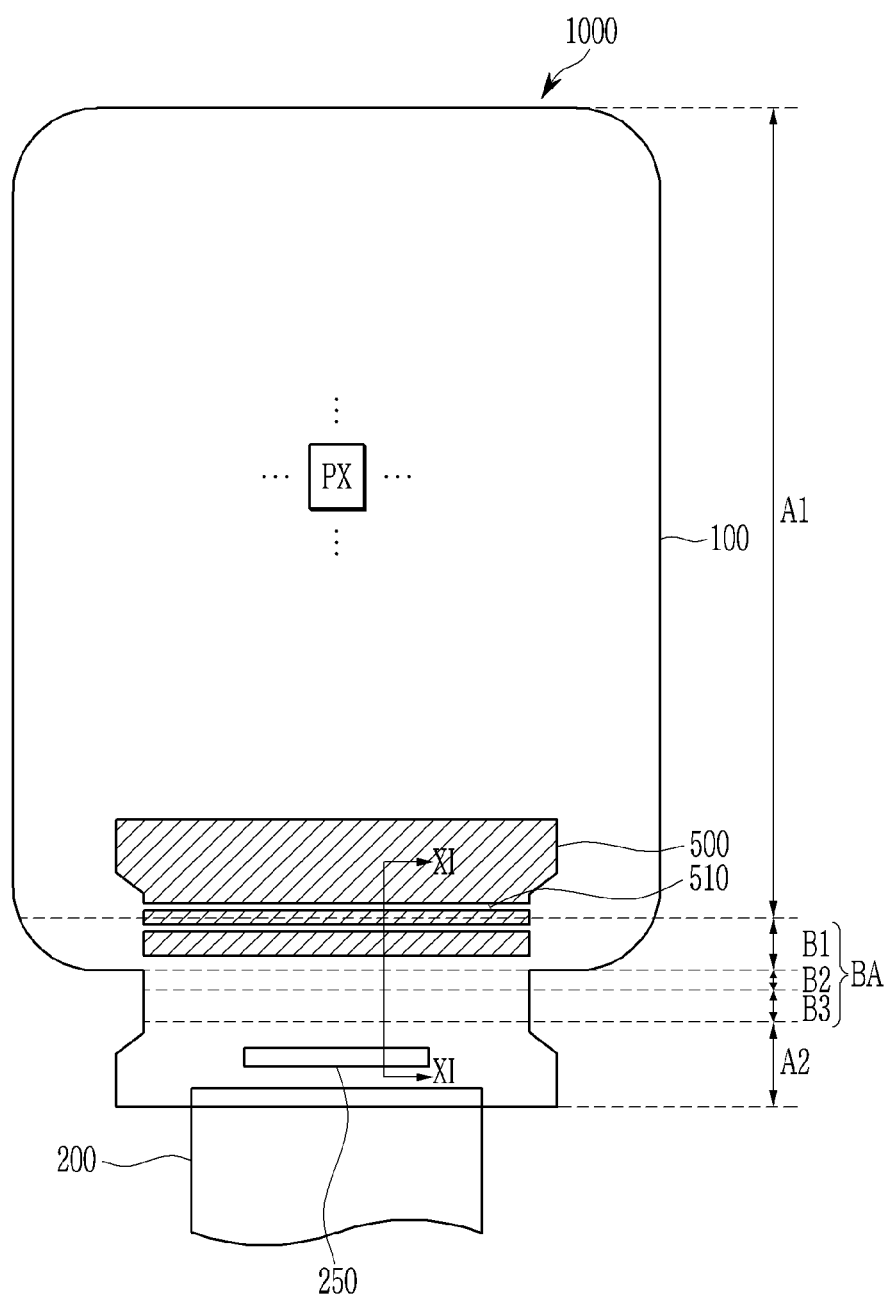
FIG. 10 is a top plan view of a display device according to another alternative exemplary embodiment.
Figure 11:
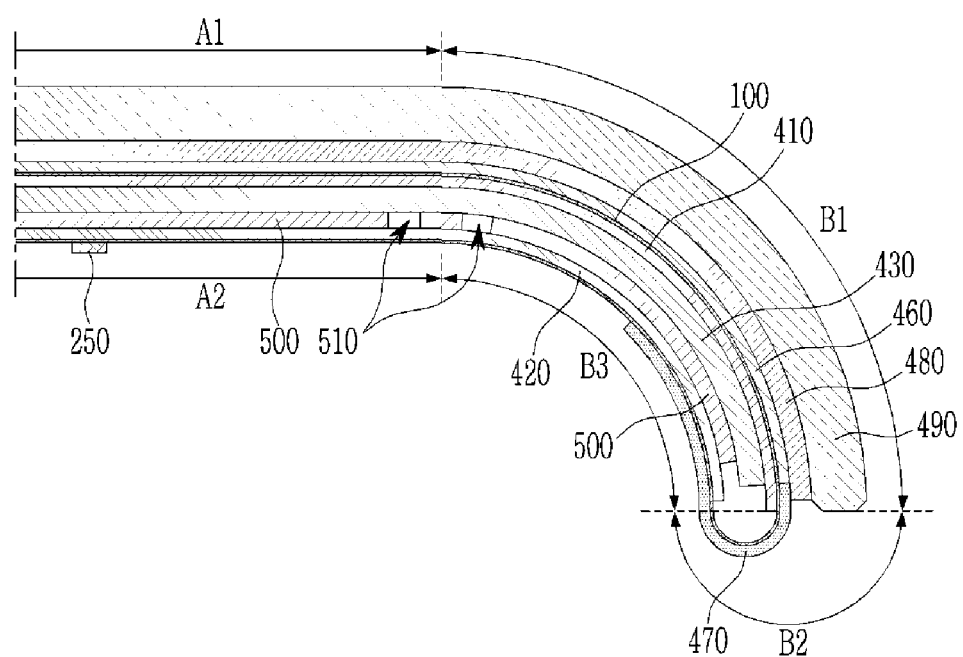
FIG. 11 is a cross-sectional view, taken along line XI-XI of the display device of FIG. 10, when the display device is in a bent state.

An exemplary embodiment of a display shown in FIG. 10 and FIG. 11 is substantially the same as the exemplary embodiments of the display device described above with reference to FIG. 1 to FIG. 4, except for a planar shape of an opening 510 of a spacer 500. The same or like elements shown in FIG. 10 and FIG. 11 have been labeled with the same reference characters as used above to describe the exemplary embodiments of the display device shown in FIG. 1 to FIG. 4, and any repetitive detailed description thereof will hereinafter be omitted or simplified.

FIG. 10 is a top plan view of a display device according to another alternative exemplary embodiment. FIG. 11 is a cross-sectional view, taken along line XI-XI of the display device of FIG. 10, when the display device in a bent state.

In an exemplary embodiment, a display device includes a display panel 100 including a first area A1, a second area A2, and a bending portion BA, and a cover window 490 located on the display panel 100. The bending portion BA includes a first bending portion B1, a second bending portion B2, and a third bending portion B3, each bent with a predetermined radius of curvature.

In an exemplary embodiment, a spacer 500 may be further located on one surface of the display panel 100. The spacer 500 may be located on an edge of the first area A1 and the first bending portion B1 of the display panel 100. While the display panel 100 is in a bent state, the spacer 500 may be disposed between the first area A1 and the second area A2 of the display panel 100 and between the first bending portion B1 and the third bending portion B3 of the display panel 100.

In such an embodiment, an opening 510 is defined in the spacer 500. The opening 510 may be located at a boundary between the first area A1 and the first bending portion B1 and the periphery thereof. When the display panel 100 is in the bent state, a boundary between the first area A1 and the first bending portion B1 may substantially match a boundary between the second area A2 and the third bending portion B3. Thus, the opening 510 is located at the boundary between the second area A2 and the third bending portion B3. A planar shape of the opening 510 may have a horizontal stripe shape. In an exemplary embodiment, as shown in FIG. 10 and FIG. 11, the opening 510 may have two horizontal stripe shapes spaced apart from each other. However, this is merely exemplary, and the shape of the opening 510 may be variously modified. In one exemplary embodiment, for example, the opening 510 may have three or more horizontal stripe shapes.

Next, a display device according to another alternative exemplary embodiment will be described with reference to FIG. 12.

Figure 12:
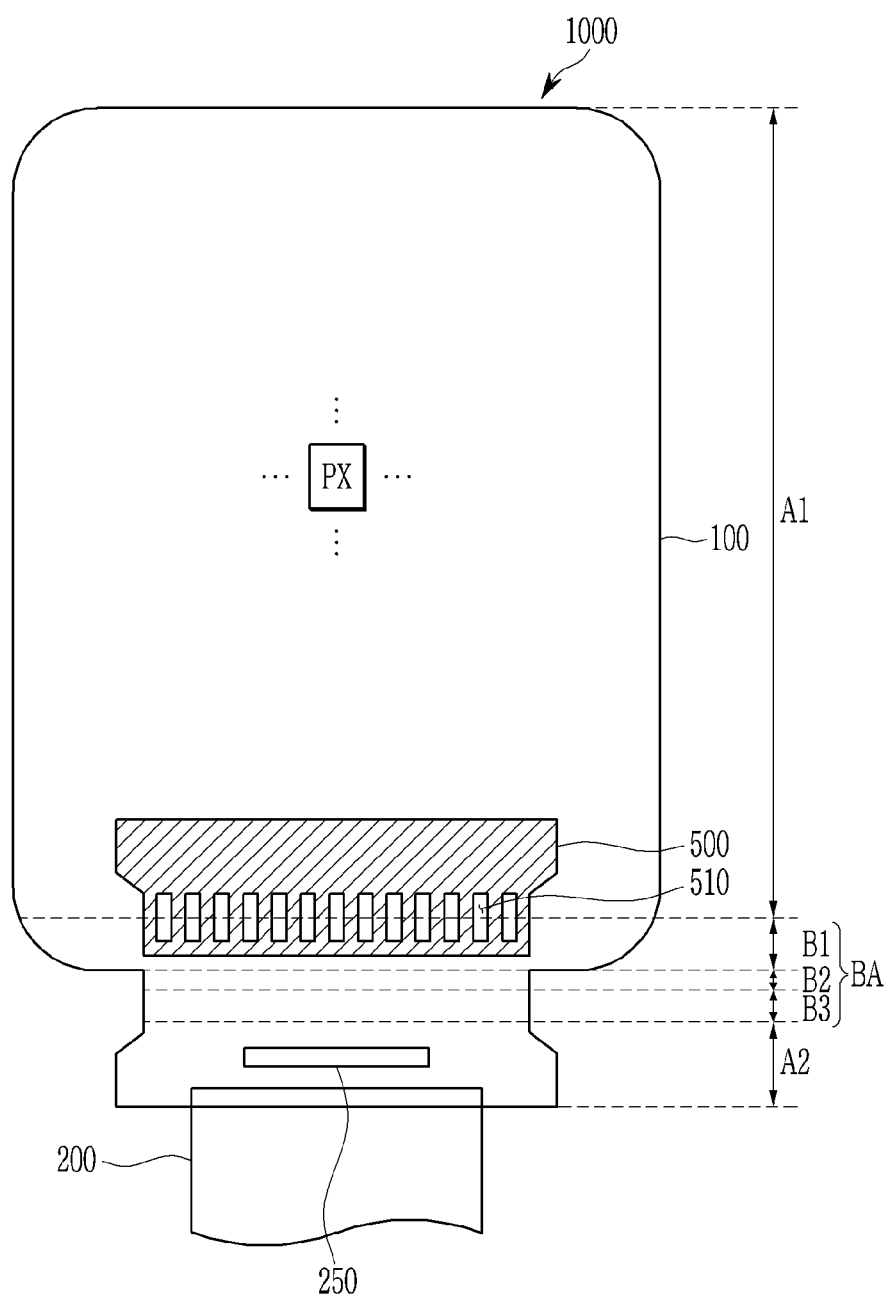
FIG. 12 is a cross-sectional view of a display device according to another alternative exemplary embodiment.

An exemplary embodiment of a display device shown in FIG. 12 is substantially the same as the exemplary embodiments of the display device described above with reference to FIG. 1 to FIG. 4 except of a planar shape of an opening 510 of a spacer 500. The same or like elements shown in FIG. 12 have been labeled with the same reference characters as used above to describe the exemplary embodiments of the display device shown in FIG. 1 to FIG. 4, and any repetitive detailed description thereof will hereinafter be omitted or simplified FIG. 12 is a cross-sectional view of a display device according to another alternative exemplary embodiment. FIG. 12 shows an exemplary embodiment of the display device in an unbent state.

in an exemplary embodiment, a display device includes a display panel 100 including a first area A1, a second area A2, and a bending portion BA, and a cover window 490 disposed on the display panel 100. The bending portion BA includes a first bending portion B1, a second bending portion B2, and a third bending portion B3, each bent with a predetermined radius of curvature.

A spacer 500 may be further located on one surface of the display panel 100. In such an embodiment, openings 510 may be defined in the spacer 500. The openings 510 of the spacer 500 may be located at a boundary between the first area A1 and the first bending portion B1 and the periphery thereof. A planar shape of each opening 510 may have a vertical stripe shape. In an exemplary embodiment, as shown in FIG. 12, a plurality of openings 510, each having a vertical stripe shape, are arranged at regular intervals. However, this is merely exemplary, and the shape of the opening 510 may be variously modified. In one exemplary embodiment, for example, the opening 510 may be in a plurality of vertical stripe shapes having different gaps or intervals therebetween.

Next, a display device according to another alternative exemplary embodiment will be described with reference to FIG. 13.

Figure 13:
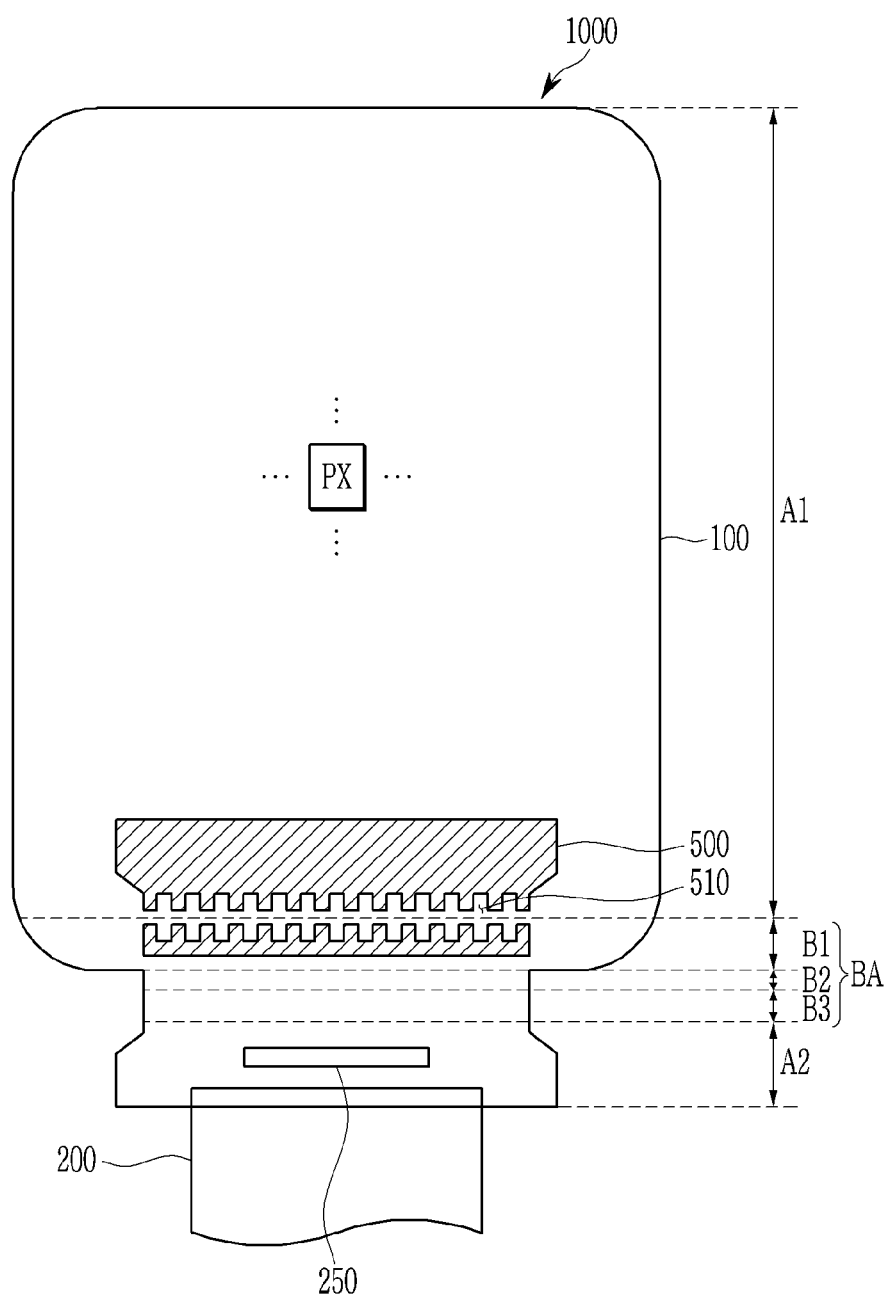
FIG. 13 is a cross-sectional view of a display device according to another alternative exemplary embodiment.

An exemplary embodiment of a display device shown in FIG. 13 is substantially the same as the exemplary embodiments of the display device described above with reference to FIG. 1 to FIG. 4, except for a planar shape of an opening 510 of a spacer 500. The same or like elements shown in FIG. 13 have been labeled with the same reference characters as used above to describe the exemplary embodiments of the display device shown in FIG. 1 to FIG. 4, and any repetitive detailed description thereof will hereinafter be omitted or simplified FIG. 13 is a cross-sectional view of a display device according to another alternative exemplary embodiment. FIG. 13 shows an exemplary embodiment of the display device in an unbent state.

In an exemplary embodiment, a display device includes a display panel 100 including a first area A1, a second area A2, and a bending portion BA, and a cover window 490 located on the display panel 100. The bending portion BA includes a first bending portion B1, a second bending portion B2, and a third bending portion B3, each bent with a predetermined radius of curvature.

A spacer 500 may be further located on one surface of the display panel 100. An opening 510 may be defined in the spacer 500. The opening 510 may be located at a boundary between the first area A1 and the first bending portion B1 and the periphery thereof. The planar shape of the opening 510 of the spacer 500 may be in a lattice pattern in which horizontal and vertical stripes intersect. In an exemplary embodiment, as shown in FIG. 13, the opening 510 may have a shape in which one horizontal stripe and a plurality of vertical stripes intersect. However, this is merely exemplary, and the shape of the opening 510 may be variously modified. In one exemplary embodiment, for example, the opening 510 may have a shape in which a plurality of horizontal stripes and a plurality of vertical strips intersect. Alternatively, the opening 510 may have a shape in which horizontal stripes and vertical stripes intersect obliquely.

Next, a display device according to another alternative exemplary embodiment will be described with reference to FIG. 14.

Figure 14:
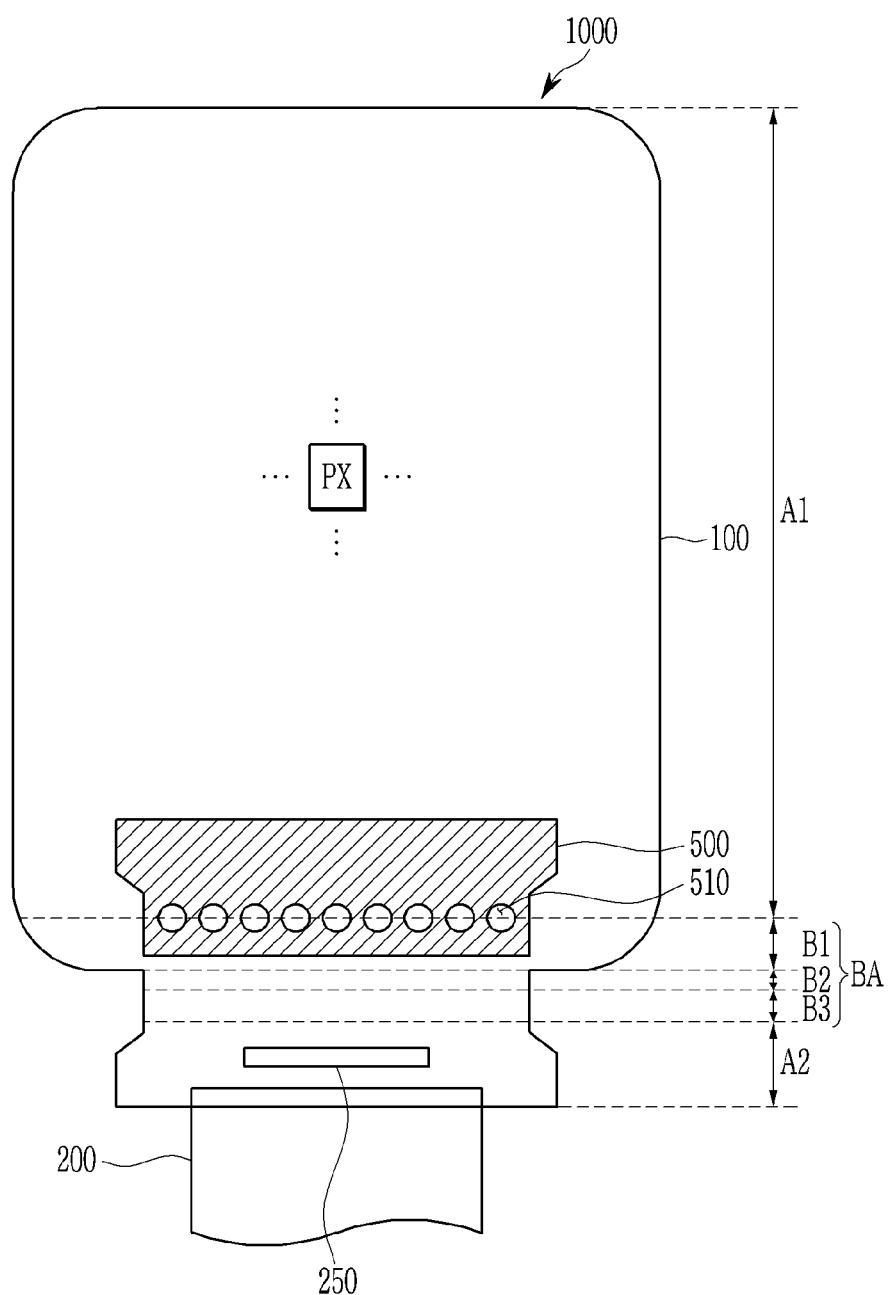
FIG. 14 is a cross-sectional view of a display device according to another alternative exemplary embodiment.

An exemplary embodiment of a display device shown in FIG. 14 is substantially the same as the exemplary embodiments of the display device described above with reference to FIG. 1 to FIG. 4 except for a planar shape of an opening 510 of a spacer 500. The same or like elements shown in FIG. 14 have been labeled with the same reference characters as used above to describe the exemplary embodiments of the display device shown in FIG. 1 to FIG. 4, and any repetitive detailed description thereof will hereinafter be omitted or simplified FIG. 14 is a cross-sectional view of a display device according to another alternative exemplary embodiment. FIG. 14 shows an exemplary embodiment of the display device in an unbent state.

In an exemplary embodiment, a display device includes a display panel 100 including a first area A1, a second area A2, and a bending portion BA, and a cover window 490 disposed on the display panel 100. The bending portion BA includes a first bending portion B1, a second bending portion B2, and a third bending portion B3, each bent with a predetermined radius of curvature.

A spacer 500 may be further located on one surface of the display panel 100. Openings 510 may be defined in the spacer 500. The openings 510 of the spacer 500 may be located at a boundary between the first area A1 and the first bending portion B1 and the periphery thereof. A planar shape of the opening 510 of the spacer 500 may have a dot shape. In an exemplary embodiment, as shown in FIG. 14, a plurality of dot patterns are arranged at regular intervals. However, this is merely exemplary, and the shape of the opening 510 may be variously modified. In one exemplary embodiment, for example, the opening 510 may be in a plurality of dot patterns that are arranged at different gaps or intervals. Alternatively, the opening 510 may be in a plurality of dot patterns, each having a different size.

Next, a display device according to another alternative exemplary embodiment will be described with reference to FIG. 15.

Figure 15:
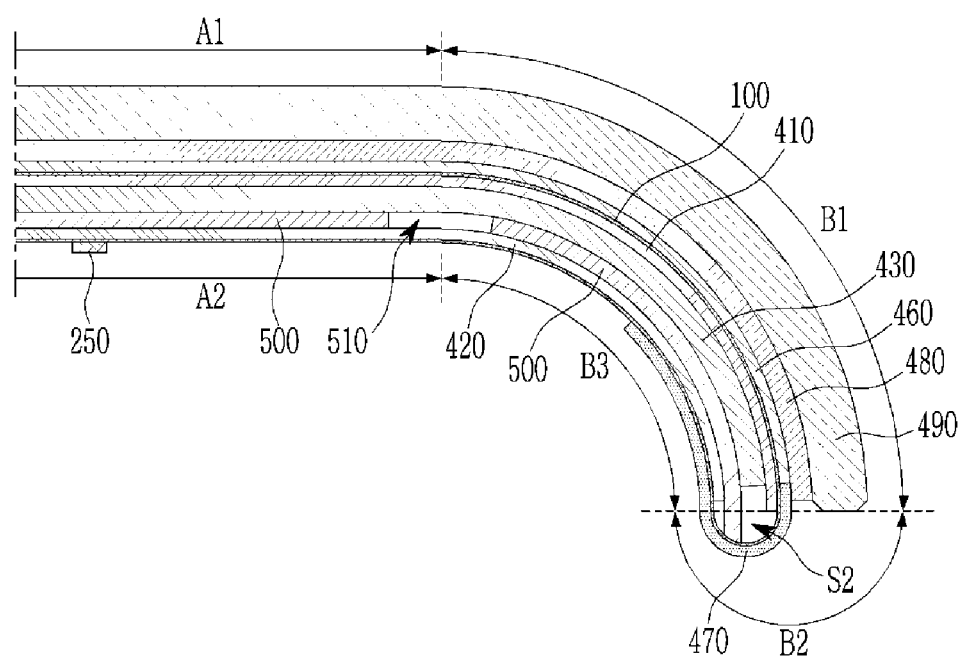
FIG. 15 is a cross-sectional view of a display device according to another alternative exemplary embodiment.

An exemplary embodiment of a display device shown in FIG. 15 is substantially the same as the exemplary embodiments of the display device described above with reference to FIG. 1 to FIG. 4, except for a spacer 500. The same or like elements shown in FIG. 15 have been labeled with the same reference characters as used above to describe the exemplary embodiments of the display device shown in FIG. 1 to FIG. 4, and any repetitive detailed description thereof will hereinafter be omitted or simplified FIG. 15 is a cross-sectional view of a display device according to another alternative exemplary embodiment. FIG. 15 shows an exemplary embodiment of the display device in a bent state.

In an exemplary embodiment, a display device includes a display panel 100 including a first area A1, a second area A2, and a bending portion BA, and a cover window 490 located on the display panel 100. The bending portion BA includes a first bending portion B1, a second bending portion B2, and a third bending portion B3, each bent with a predetermined radius of curvature.

In an exemplary embodiment, a spacer 500 may be further located on one surface of the display panel 100. When the display panel 100 is in the bent state, the spacer 500 may be disposed between the first area A1 and the second area A2 of the display panel 100, and may be disposed between the first bending portion B1 and the third bending portion B3 of the display panel 100. In such an embodiment, the spacer 500 may be further located in a space S2 surrounded by the second bending portion B2 of the display panel 100. In an exemplary embodiment, as shown in FIG. 4, the spacer 500 is not located on the second bending portion B2. In an alternative exemplary embodiment, as shown in FIG. 15, the spacer 500 is also disposed on the second bending portion B2. In such an embodiment, the spacer 500 extends further than in the exemplary embodiment shown in FIG. 4.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
   a display panel including a first area, a second area, and a bending portion between the first area and the second area; and
   a cover window disposed on the display panel,
   wherein
   the first area of the display panel is disposed between the cover window and the second area of the display panel when the display panel is in a bent state,
   the bending portion comprises:
   a first bending portion extending to the first area,
   a second bending portion extending to the first bending portion, and
   a third bending portion disposed between the second bending portion and the second area,
   the first bending portion is disposed between the cover window and the third bending portion when the display panel is in the bent state,
   an entirety of the second bending portion is entirely curved and disposed directly between the first bending portion and the third bending portion,
   a radius of curvature of the second bending portion is less than a radius of curvature of the first bending portion, and the radius of curvature of the second bending portion is less than a radius of curvature of the third bending portion.

2. The display device of claim 1, wherein the second bending portion is disposed directly between the first bending portion and the second bending portion.

3. The display device of claim 2, wherein the first bending portion is disposed directly between the first portion and the second bending portion, and
   the third bending portion is disposed directly between the second bending portion and the second portion.

4. The display device of claim 1, wherein the radius of curvature of the first bending portion is less than a radius of curvature of a portion of the cover window corresponding thereto.

5. The display device of claim 4, wherein the radius of curvature of the third bending portion is less than the radius of curvature of the first bending portion.

6. The display device of claim 5, wherein
   the first bending portion comprises an outer surface which faces the cover window and an inner surface which faces the third bending portion, and
   a radius of curvature of the inner surface is less than or equal to a radius of curvature of the outer surface.

7. The display device of claim 1, wherein the radius of curvature of the third bending portion is less than the radius of curvature of the first bending portion.

8. The display device of claim 1, wherein the cover window covers the first area and the first bending portion.

9. The display device of claim 8, wherein the cover window does not cover at least a part of the second bending portion.

10. The display device of claim 9, wherein a shortest distance to the cover window from a tangent line of the second bending portion which is parallel with the first area is greater than about 0.1 mm and less than about 1.0 mm.

11. The display device of claim 9, further comprising:
    a chassis disposed below the display panel to cover a lower portion and a part of a side surface of the display panel.

12. The display device of claim 11, wherein the at least a part of the second bending portion that is not covered by the cover window is covered by the chassis.

13. The display device of claim 1, wherein the cover window covers the first area, the first bending portion and the second bending portion.

14. The display device of claim 13, wherein a shortest distance to the cover window from a tangent line of the second bending portion which is parallel with the first area is greater than about zero mm and less than about 1.0 mm.

15. The display device of claim 1, wherein a distance between the first bending portion and the third bending portion is substantially constant.

16. The display device of claim 1, wherein a distance between the first bending portion and the third bending portion is gradually decreased or gradually increased as going closer to the second bending portion at a portion adjacent to the second bending portion.

* * * * *